United States Patent [19]
Greason et al.

[11] Patent Number: 5,736,870
[45] Date of Patent: Apr. 7, 1998

[54] METHOD AND APPARATUS FOR BI-DIRECTIONAL BUS DRIVER

[75] Inventors: Jeffrey K. Greason, Portland; James P. Kolousek, Gaston, both of Oreg.

[73] Assignee: Intel Corporation, Santa Clara, Calif.

[21] Appl. No.: 580,131

[22] Filed: Dec. 28, 1995

[51] Int. Cl.$^6$ .................................... H03K 19/0175
[52] U.S. Cl. ........................ 326/86; 326/90; 395/851
[58] Field of Search ...................... 326/86, 30, 90; 395/851

[56] References Cited

U.S. PATENT DOCUMENTS

| | | | |
|---|---|---|---|
| 4,283,760 | 8/1981 | Kita et al. | 395/851 |
| 4,945,264 | 7/1990 | Lee | 326/30 |
| 4,982,115 | 1/1991 | Lee | 326/86 |
| 5,214,330 | 5/1993 | Okazaki | 326/30 |
| 5,248,908 | 9/1993 | Kimura | 326/86 |
| 5,274,769 | 12/1993 | Ishida | 395/851 |
| 5,432,465 | 7/1995 | Hsi-Jung | 326/86 |

*Primary Examiner*—Edward P. Westin
*Assistant Examiner*—Benjamin D. Driscoll
*Attorney, Agent, or Firm*—Blakely, Sokoloff, Taylor & Zafman

[57] ABSTRACT

A bidirectional bus circuit according to the present invention typically includes: (a) a first and a second bus line portion for carrying a bidirectional bus signal, where the first bus line portion has a first and a second end, and the second bus line portion has a third and a fourth end; (b) a bus direction sense line for carrying a bus direction signal; (c) a sensing circuit coupled to the sense line for detecting the bus direction signal; and (d) a driving circuit coupled to the sensing circuit and coupled between the second end of the first bus line portion and the third end of the second bus line portion for driving the first and second bus line portions. According to one embodiment of the present invention, the sensing circuit may include a cross coupled NAND gate latch or a cross coupled NOR gate latch. The driving circuit may include a first buffer circuit for driving the first bus line portion and a second buffer circuit for driving the second bus line portion. At a given time, only one of the buffer circuits is enabled. The sensing circuit may be coupled to other driving circuits that are in series with the driving circuit mentioned above. Also, the sensing circuit may be coupled to other driving circuits that are in parallel with the driving circuit mentioned above as long as the bus signals along their respective bus line portions travel in the same direction at a given time.

23 Claims, 7 Drawing Sheets

METHOD AND APPARATUS FOR BI-DIRECTIONAL BUS DRIVER

BACKGROUND OF THE INVENTION

1. Field of the Invention

The present invention relates to the field of bus drivers and, in particular, to bidirectional bus drivers.

2. Description of Related Art

Referring to FIG. 1a, an interconnect line such as a bus line 25 is employed to carry a bus signal from a circuit 10 to a circuit 20. Because of the resistance and capacitance of bus line 25, the integrity of the bus signal and speed can be seriously degraded, particularly when the line runs over a long distance. In order not to degrade the signal that is carried on bus line 25, circuit 10 must be able to drive bus line 25. However, if bus line 25 is too long for circuit 10 to drive, then a repeater is typically employed.

In FIG. 1b, a repeater 24 is inserted between bus line portions 22 and 26 so that while circuit 10 drives bus portion 22, repeater 24 drives bus line portion 26. Because repeater 24 is unidirectional, repeater 24 can only drive a signal that is originated from circuit 10 and received by circuit 20. If the signal direction is changed (e.g., a signal is sent from circuit 20 to circuit 10), then repeater 24 cannot be used. The input of repeater 24 is connected to bus line portion 22, and the output of repeater 24 is connected to bus line portion 26, and the input and output of repeater 24 cannot be reversed. Also, repeater 24 does not have the ability to detect the direction of a signal that is carried on bus line portions 22 and 26.

If signals are sent bidirectionally between two circuits, then two repeaters are needed as shown in FIG. 2. For a signal sent from a circuit 30 to a circuit 40, a repeater 34 is inserted between bus line portions 32 and 36. For a signal that is sent from circuit 40 to circuit 30, a repeater 44 is inserted between bus line portions 42 and 46.

If one bus line instead of two bus lines is to be used between two circuits that send signals bidirectionally, then a conventional repeater cannot be employed. Hence, circuits such as 50 and 60 are necessarily placed closer to each other to shorten the length of the bus line 52 as shown in FIG. 3.

The disadvantage of a conventional repeater is that it is unidirectional. Hence, it can only be used along a unidirectional bus line. Also, if signals need to be communicated in both ways between circuits, then the conventional scheme requires two repeaters and two separate sets of unidirectional bus line portions as shown in FIG. 2. In addition, if a bus line is bidirectional, then the conventional repeater cannot be used at all.

Therefore, there is a need for a repeater circuit that can drive bidirectional bus lines. Having bidirectional lines rather than unidirectional lines is advantageous because one bidirectional line can replace two unidirectional lines, thereby minimizing the area occupied by interconnect lines approximately by half. This is especially beneficial as the number of the interconnect lines and the physical size of circuit chips increase. Hence, there is a greater need for bidirectional repeaters in larger chips. As the circuit chip size increases, the width and thickness of the interconnect lines tend to decrease while the length increases, and thus, the resistance and parasitic capacitance of the interconnect lines become larger. As a result, signal degradation becomes worse. Bidirectional repeaters can solve these problems and enhance the signal integrity and speed. To drive a bidirectional bus line, a bidirectional repeater needs to be able to detect the direction of the signal that is carried on a bidirectional bus line, and drive the bidirectional bus line according to the direction.

SUMMARY OF THE INVENTION

The present invention provides a self-directioning bidirectional bus circuit that can sense the direction of bus signals and drive bus lines in the direction of the bus signals.

A bidirectional bus circuit according to the present invention typically includes: (a) a first and a second bus line portion for carrying a bidirectional bus signal, where the first bus line portion has a first and a second end, and the second bus line portion has a third and a fourth end; (b) a bus direction sense line for carrying a bus direction signal; (c) a sensing circuit coupled to the sense line for detecting the bus direction signal; and (d) a driving circuit coupled to the sensing circuit and coupled between the second end of the first bus line portion and the third end of the second bus line portion for driving the first and second bus line portions.

According to one embodiment of the present invention, the sensing circuit may include: (a) a first NAND gate having a first and a second sense input line and a first sense output line, where the first sense input line is coupled to the bus direction sense line, and the first sense output line is coupled to the driving circuit; and (b) a second NAND gate having a third and a fourth sense input line and a second sense output line, where the third sense input line is coupled to the bus direction sense line, the fourth sense input line is coupled to the first sense output line, and the second sense output line is coupled to the second sense input line and to the driving circuit. It should be noted that instead of having the NAND gates, the sensing circuit may include two NOR gates.

The sensing circuit may be coupled to other driving circuits that are in series with the driving circuit mentioned above. Also, the sensing circuit may be coupled to other driving circuits that are in parallel with the driving circuit mentioned above as long as the bus signals along their respective bus line portions travel in the same direction at a given time.

In addition, the driving circuit may include: (a) a first buffer circuit having a first buffer input line, a first buffer output line, and a first and a second buffer enable line, where the first buffer input line is coupled to the second end of the first bus line portion, and the first buffer output line is coupled to the third end of the second bus line portion; and (b) a second buffer circuit having a second buffer input line, a second buffer output line, and a third and a fourth buffer enable line, where the second buffer input line is coupled to the second end of the first bus line portion, the second buffer output line is coupled to the third end of the second bus line portion, the third buffer enable line is coupled to the second buffer enable line and to the sensing circuit, and the fourth buffer enable line is coupled to the first buffer enable line and to the sensing circuit.

In operation, the bus direction signal and the bus signal travel in the same direction. The sensing circuit may detect the bus direction signal through the first and second sense input lines and enable one of its output lines depending on the direction of the bus direction signal traveling down the bus direction sense line. One of the output lines of the sensing circuit enables one of the two buffers in the driving circuit and disables the other so that the enabled buffer can drive one of the bus line portions in the direction of the bus signal. It should be noted that at a given time, only one of the buffers is enabled.

The present invention also provides a method of driving a bidirectional bus line in a bidirectional bus circuit. The method includes the steps of: (a) determining the direction of a bus signal on a bidirectional bus line; and (b) driving the bidirectional bus line in the direction of the bus signal.

BRIEF DESCRIPTION OF THE DRAWINGS

The features, aspects, and advantages of the present invention will become more fully apparent from the following detailed description, appended claims, and accompanying drawings in which:

DETAILED DESCRIPTION OF THE INVENTION

In the following description, numerous specific details are set forth to provide a thorough understanding of the present invention. However, one having an ordinary skill in the art may be able to practice the invention without these specific details. In some instances, well-known circuits, structures and techniques have not been shown in detail not to unnecessarily obscure the present invention.

Figure 1A:
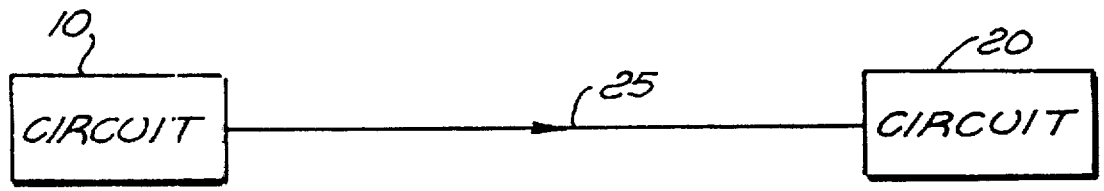
FIG. 1a is a block diagram of a conventional unidirectional bus line connected between two circuits.
Figure 1B:
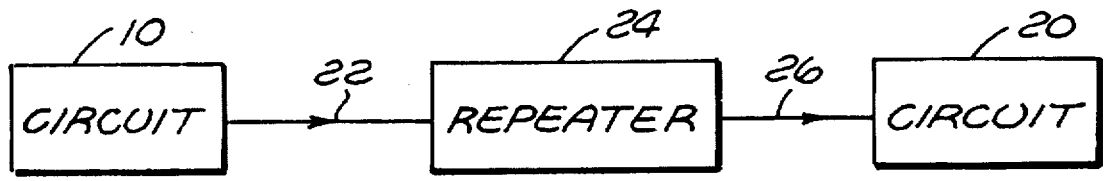
FIG. 1b is a block diagram of a conventional repeater inserted between two unidirectional bus line portions for carrying a unidirectional signal between two circuits.
Figure 2:
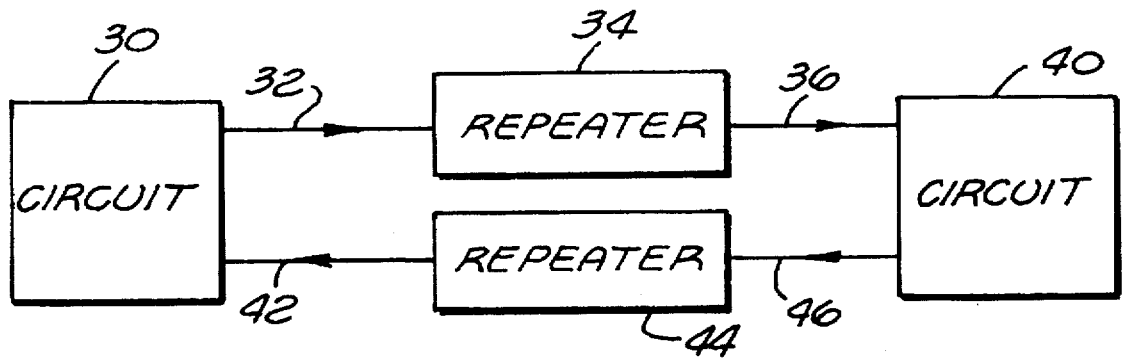
FIG. 2 is a block diagram of conventional repeaters provided for two separate unidirectional bus lines.
Figure 3:
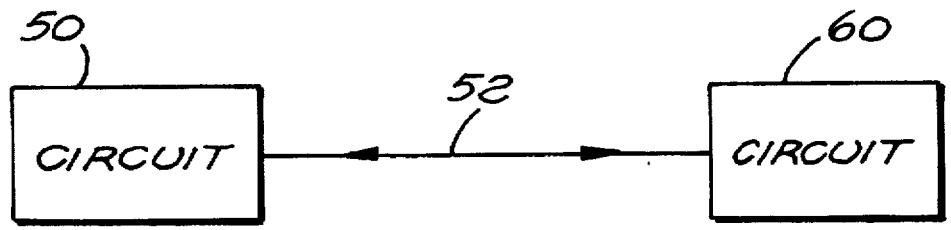
FIG. 3 is a block diagram of a conventional bidirectional bus line connecting two circuits.
Figure 4:
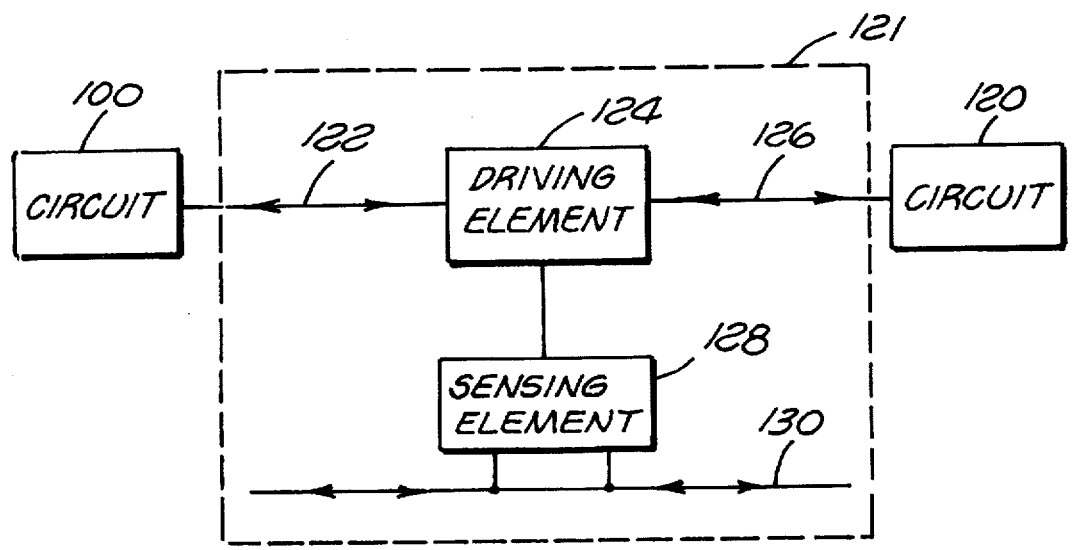
FIG. 4 is a bidirectional bus circuit for driving two bus line portions between two circuits embodying features of the present invention.

FIG. 4 is a bidirectional bus circuit 121 connected between circuits 100 and 120 according to the present invention. Bidirectional bus circuit 121 includes two bus line portions 122 and 126, a bus direction sense line 130, a sensing element 128, and a driving element 124. Bus line portions 122 and 126 carry bidirectional bus signals between circuits 100 and 120. Bus direction sense line 130 carries a bus direction signal indicating whether a bus signal along bus line portions 122 and 126 is traveling from circuit 100 to 120 or from circuit 120 to circuit 100. A bus direction signal typically travels in the same direction as the bus signal on bus line portions 122 and 126.

Sensing element 128 is used to detect the bus direction signal that travels along bus direction sense line 130 and to enable driving element 124 to drive bus line portions 122 and 126 in the correct direction. Driving element 124 drives bus line portion 122 if the bus signal is traveling from circuit 120 to 100 or drives bus line portion 126 if the bus signal is traveling from circuit 100 to 120.

It should be noted that multiple driving elements can be placed in series with driving element 124 between circuits 100 and 120 if the distance between the circuits is excessively long.

Figure 5:
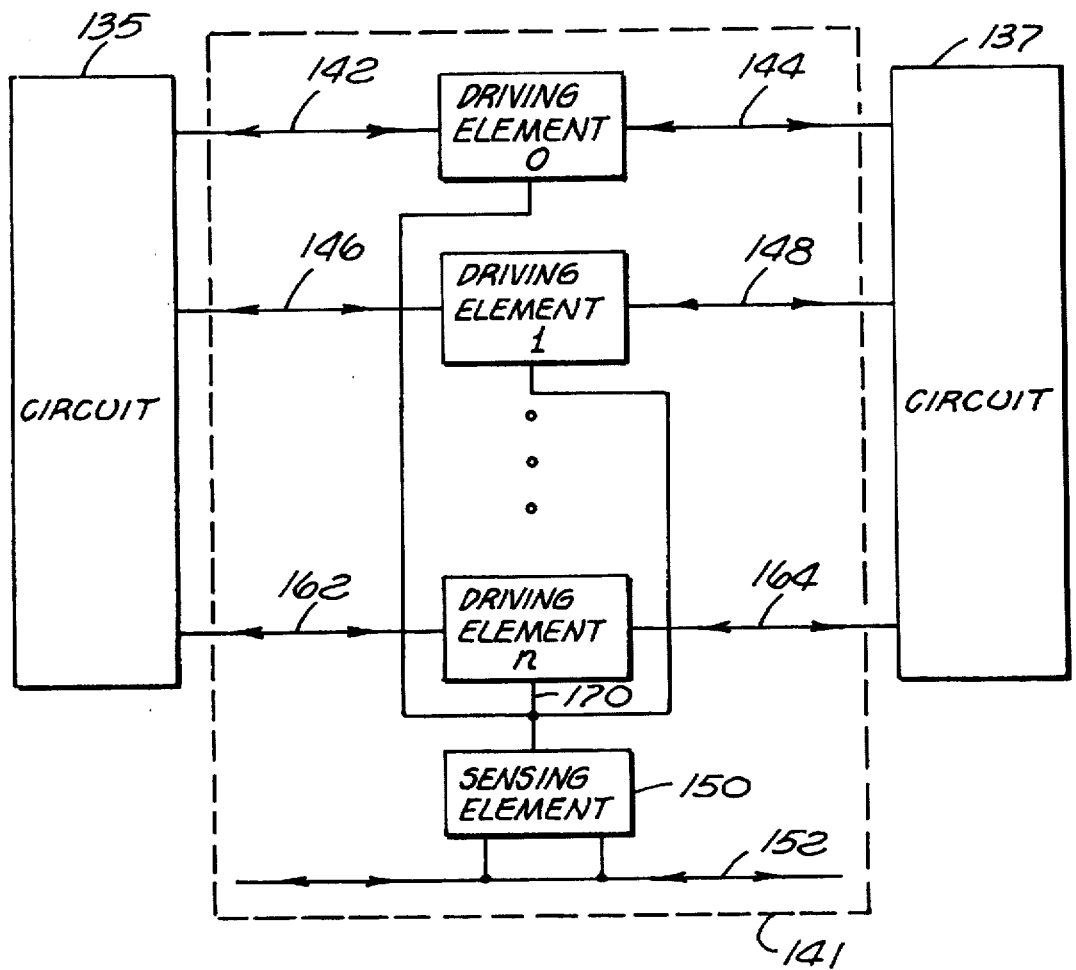
FIG. 5 is a bidirectional bus circuit for driving a plurality of sets of bus line portions connecting two circuits.

In FIG. 5, a bidirectional bus circuit 141 is shown having a plurality of sets of bus line portions that are bidirectional between two circuits 135 and 137 according to the present invention. Bidirectional bus circuit 141 in FIG. 5 includes a plurality of sets of bus line portions 142, 144, 146, 148, . . . , 162, and 164, a bus direction sense line 152, a sensing element 150, and a plurality of driving elements 0-n. When the plurality of sets of bus line portions 142-164 carry signals in a common direction (either from circuit 135 to circuit 137 or from circuit 137 to circuit 135), bidirectional bus circuit 141 requires only one sensing element (150) and one bus direction sense line (152) for the multiple driving elements and multiple sets of bus line portions. Hence, bidirectional bus circuit 141 consumes a minimum area. This is especially beneficial for large circuit chips.

Figure 6:
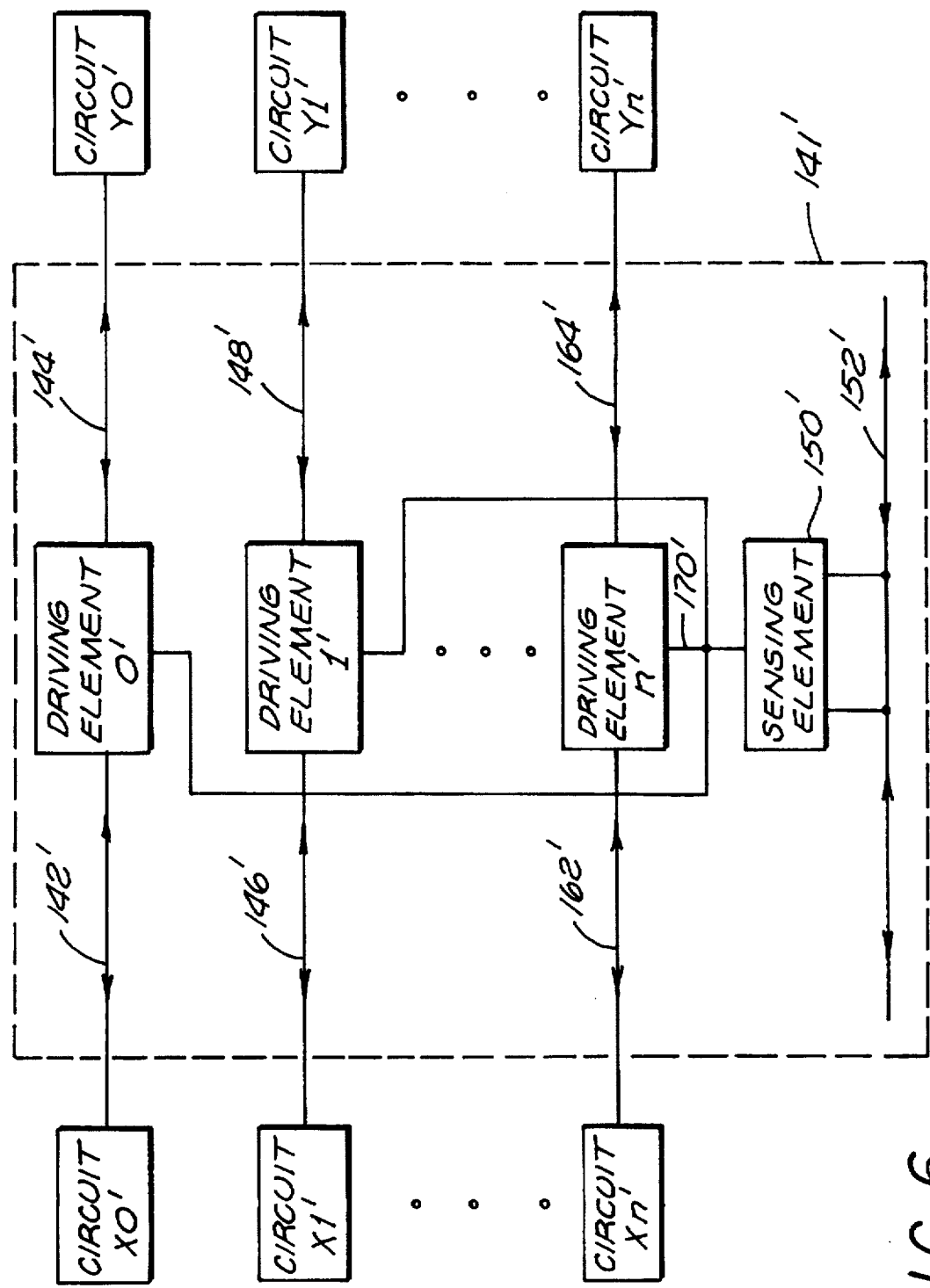
FIG. 6 is a bidirectional bus circuit for driving a plurality of sets of bus line portions for carrying bidirectional signals between their corresponding sets of circuits.

FIG. 6 shows how a bidirectional bus circuit 141' can be used to drive multiple sets of bus line portions where each set of the bus line portions is connected to its corresponding set of circuits. Bidirectional bus circuit 141' in FIG. 6 includes a plurality of sets of bus line portions 142', 144', 146', 148', . . . , 162', and 164', a bus direction sense line 152', a sensing element 150', and a plurality of driving elements 0'-n'. Bus line portion 142' is connected to a circuit X0' while bus line portion 144' is connected to a circuit Y0'. Bus line portions 146', 148', 162' and 164' are connected to their corresponding circuits X1', Y1', Xn', and Yn', respectively. Again, a single sensing element 150' and a single bus direction sense line 152' can be used with multiple driving elements and multiple sets of bus line portions if all of the bus line portions carry signals in the same direction in a given instance.

Figure 7A:
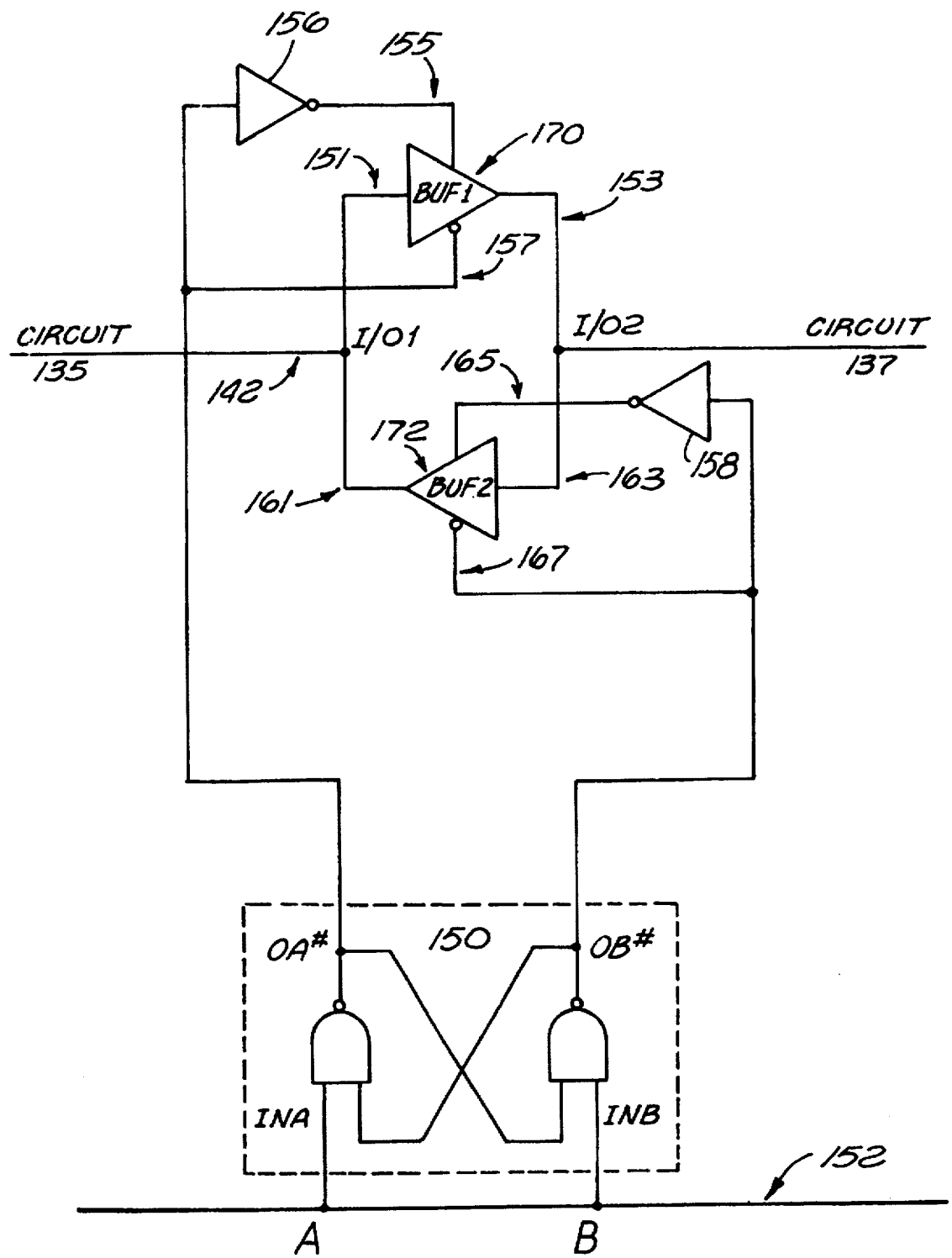
FIG. 7a is a circuit schematic representation of a bidirectional bus circuit according to one embodiment of the present invention using a NAND gate sensing circuit.

FIG. 7a is a circuit schematic representation of driving element 0 (see FIG. 5). Sensing element 150 includes two input lines INA and INB and two output lines OA# and OB#. Input line INA is connected to bus direction sense line 152 at a point A, while input line INB is connected to bus direction sense line 152 at a point B. Sensing element 150 detects the bus direction signal that travels along bus direction sense line 152 at points A and B, and activates one of the two output lines OA# or OB# depending on the direction of the bus direction signal on bus direction sense line 152.

Driving element 0 in FIG. 7a includes two buffers, BUF 1 and BUF 2, according to one embodiment of the present invention. BUF 1 includes an input line 151, an output line 153, and two enable lines 155 and 157. Input line 151 of BUF 1 is connected to bus line portion 142 at I/O 1. Output line 153 of BUF 1 is connected to bus line portion 144 at I/O 2. Enable line 155 is connected to output line OA# thru inverter 156. Enable line 157 of BUF 1 is connected directly to output line OA#.

BUF 2 includes an input line 163, an output line 161, and two enable lines 165 and 167. Output line 161 is connected to bus line portion 142 at I/O 1. Input line 163 of BUF 2 is connected to bus line portion 144 at I/O 2. Enable line 165 of BUF 2 is connected to output line OB# thru inverter 158 while enable line 167 is connected directly to output line OB#.

Only one of BUF 1 or BUF 2 is enabled at a time depending on the direction of the bus signal traveling along bus line portions 142 and 144. In addition, the bus direction signal typically travels in the same direction as the bus signal.

If the bus signal along bus line portions 142 and 144 travels from circuit 135 to circuit 137, then the bus direction signal along bus direction sense line 152 also travels from left to right, and sensing element 150 asserts output line OA# low while asserting output line OB# high so that BUF 1 is enabled, and BUF 2 is disabled. Thus, BUF 1 drives bus line portion 144.

If, on the other hand, the bus signal on bus line portions 142 and 144 travels from circuit 137 to circuit 135, then the bus direction signal on bus direction sense line 152 travels from right to left, and sensing element 150 asserts output line OB# low while asserting output line OA# high. In this instance, BUF 2 is enabled while BUF 1 is disabled. Hence, BUF 2 drives bus line portion 142. Therefore, only one of the two buffers (BUF 1 or BUF 2) is enabled at a time corresponding to the direction of the bus signal on bus line portions 142 and 144. It should be noted that output lines OA# and OB# can be also connected to other bus line portions as shown in FIGS. 5 and 6.

Figure 7B:
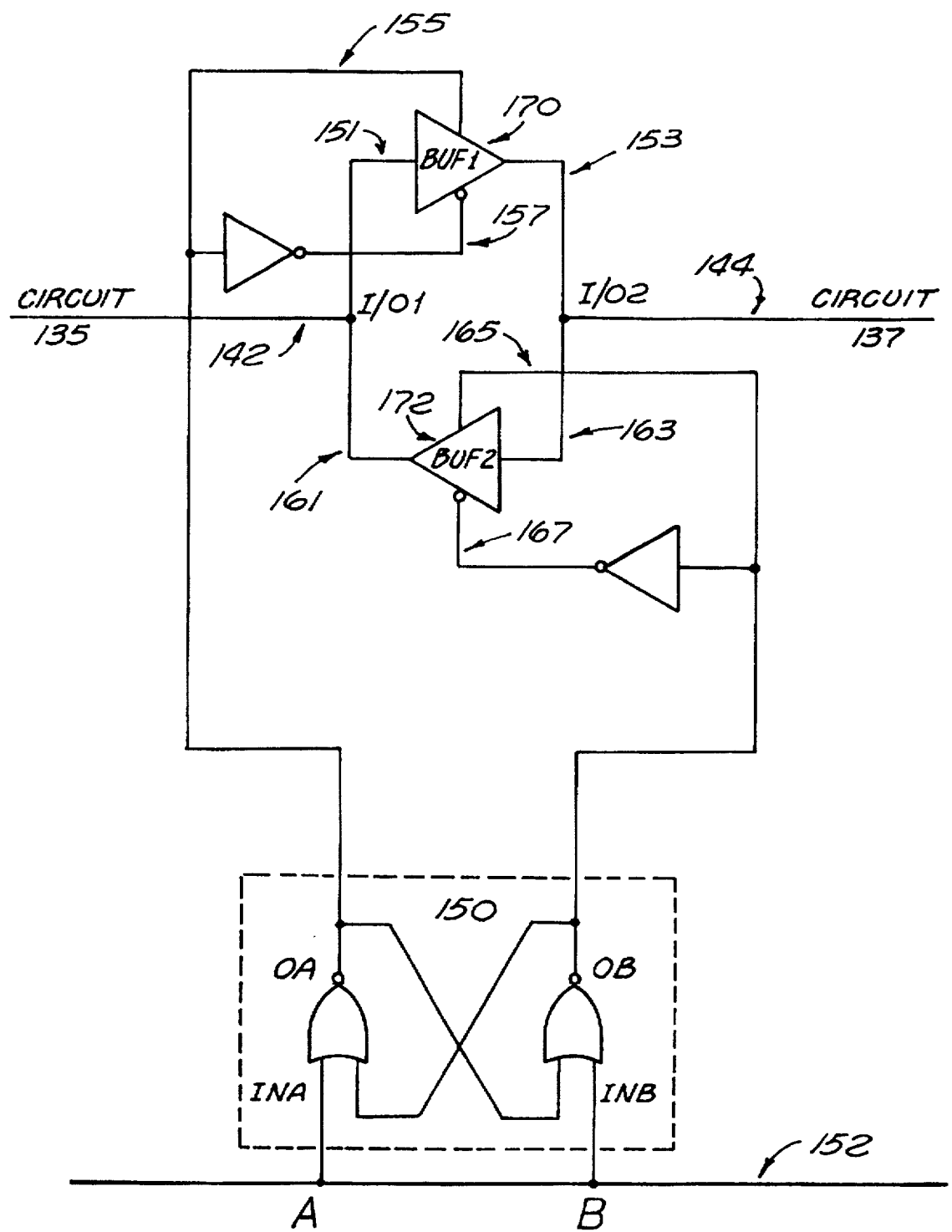
FIG. 7b is a circuit schematic representation of a bidirectional bus circuit according to one embodiment of the present invention using a NOR gate sensing circuit.

FIG. 7b is similar to FIG. 7a excepting that sensing element 150 uses a NOR gate sensing circuit.

Figure 8:
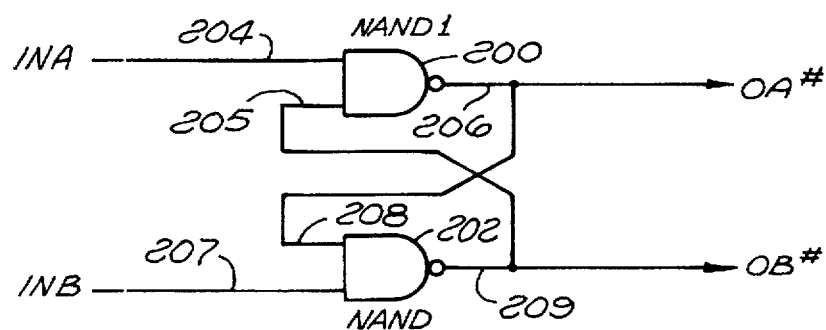
FIG. 8 is a circuit schematic representation of a sensing element according to one embodiment of the present invention.

FIG. 8 is a circuit schematic representation of sensing element 150 according to one embodiment of the present invention. Sensing element 150 in FIG. 8 includes two NAND gates 200 and 202. NAND gates 200 and 202 form a cross-coupled NAND gate latch. NAND gate 200 includes two input lines 204 and 205 and output line OA#. Input line 204 is input line INA. NAND gate 202 includes two input lines 207 and 208 and output line OB#. Input line 207 is input line INB. Input line 205 of NAND gate 200 receives its input from output line OB# while input line 208 of NAND gate 202 receives its input from output line OA#.

The operation of the sense element in FIG. 8 will be described. Because it requires a finite amount of time for a signal to travel down an interconnect line such as bus direction sense line 152 in FIGS. 7a and 7b, only one of the output line OA# or OB# of the sensing element will change the state depending on which input of the sensing element transitions first.

Figure 9:
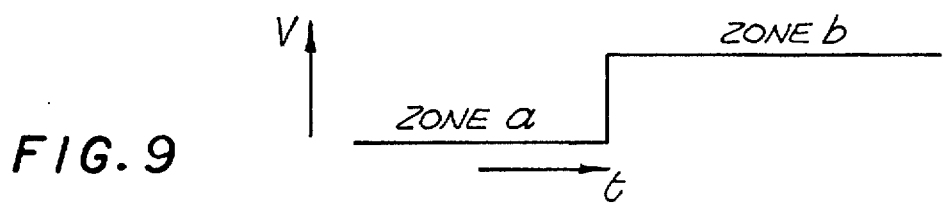
FIG. 9 is a bus direction signal that can be sent along a bus direction sense line according to one embodiment of the present invention.

To illustrate this, a bus direction signal that travels along bus direction sense line 152 is shown in FIG. 9. If the bus direction signal of FIG. 9 travels down bus direction sense line 152 from left to right in FIG. 7a, then the bus direction signal will encounter point A in FIG. 7a first and then point B. Initially, input lines INA and INB will be both low (zone a). However, input line INA will encounter the high voltage (zone b) first while input line INB still remains at the low voltage because of the finite amount of time required for the signal to travel from point A to point B. When input line INA is high and input line INB is low, output line OA# is low while output line OB# is high. Thus, output line OA# is asserted low while output line OB# is asserted high. The values of the output lines remain constant even when input line INB becomes high (zone b of the bus direction signal) because NAND gates 200 and 202 form a latch.

When output line OA# is asserted low, BUF 1 is enabled while BUF 2 is disabled in FIG. 7a. In that instance, the bus signal travels from left to right along bus line portions 142 and 144, and BUF 1 is enabled to drive bus line portion 144.

If the bus signal along bus line portions 142 and 144 travels from circuit 137 to circuit 135 (from right to left), then the bus direction signal along bus direction sense line 152 in FIG. 7a travels from right to left. In that instance, output line OB# is asserted low while output line OA# is asserted high so that BUF 2 is enabled to drive bus line portion 142 while BUF 1 is disabled.

Figure 10:
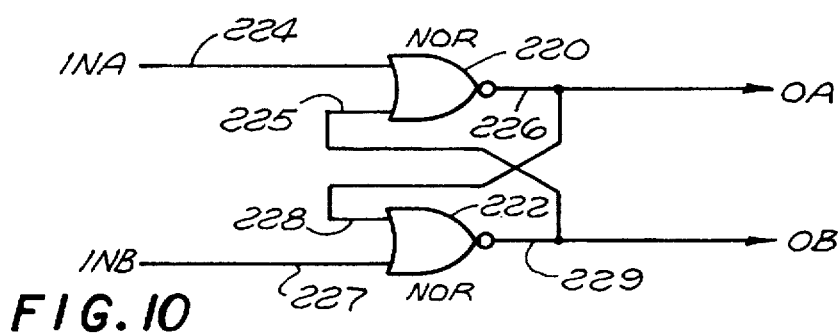
FIG. 10 is a circuit schematic representation of a sensing element according to another embodiment of the present invention.

FIG. 10 is a circuit schematic representation of sensing element 150 according to a second embodiment of the present invention. The sensing element in FIG. 10 is the same as the sensing element in FIG. 8 except that NAND gates 200 and 202 are replaced by NOR gates 220 and 222, and output lines OA# and OB# are switched to OA and OB, respectively.

Figure 11:
FIG. 11 is a bus direction signal that can be sent along a bus direction sense line according to another embodiment of the present invention.

To illustrate the operation of the sensing element in FIG. 10, a bus direction signal is shown in FIG. 11. In 7b, if the bus signal is sent from circuit 135 to circuit 137, then the bus direction signal shown in FIG. 11 will be also sent from left to right in the same direction as the bus signal. In that instance, initially, input lines INA and INB are at a high voltage (zone a'). Subsequently, input line INA receives the low voltage (zone b') while input line INB remains at the high voltage because of the finite amount of time required for the bus direction signal to travel down bus direction sense line 152. Output line OB is asserted low in this instance while output line OA is asserted high so that BUF 1 in 7b is enabled to drive bus line portion 144 while BUF 2 is disabled.

If a bus signal travels from circuit 137 to circuit 135, then the bus direction signal shown in FIG. 11 travels from right to left. In that instance, while input line INA remains at the high voltage, input line INB transitions to the low voltage (zone b') first so that output line OB is asserted high while output line OA is asserted low. Hence, BUF 1 in 7b is disabled while BUF 2 is enabled and drives bus line portion 142.

Figure 12:
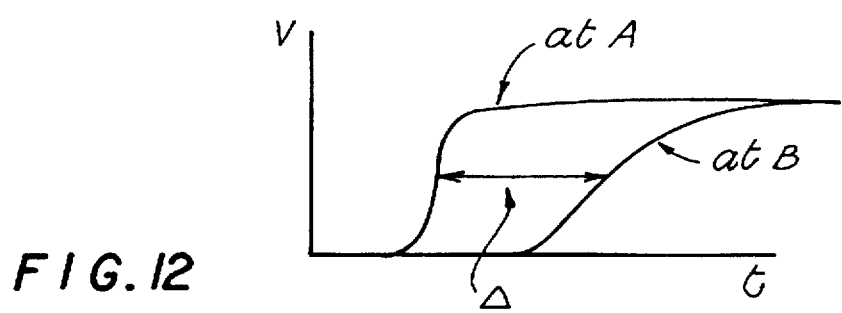
FIG. 12 illustrates bus direction signals that can be seen at points A and B along the bus direction sense line shown in FIGS. 7a and 7b.

FIG. 12 shows bus direction signals that appear at point A and point B on bus direction sense line 152 in FIGS. 7a and 7b. Because of the resistance and capacitance of bus direction sense line 152, the signals that travel along that line can be degraded as shown in FIG. 12. A simulation of a sensing element of the present invention that uses a 0.4μ process indicates that the sensing element can operate properly for a signal delta ($\Delta$) in the range of 5-25 pico seconds. This signal delta ($\Delta$) is the time difference between when a bus direction signal arrives at point A and when the bus direction signal arrives at point B. Provided that the time difference for a signal to arrive from point A to point B or vice-a-versa is the same as or greater than the switching time of the NAND or NOR gates implemented in the sensing element, the circuit will be stable. If the logic gates selected are slow switching, it would be obvious for one of ordinary skill in the art to introduce a suitable delay element (not shown) between points A and B such that the gate to which the signal first arrives switches prior to that same signal arriving at the other gate.

Figure 13:
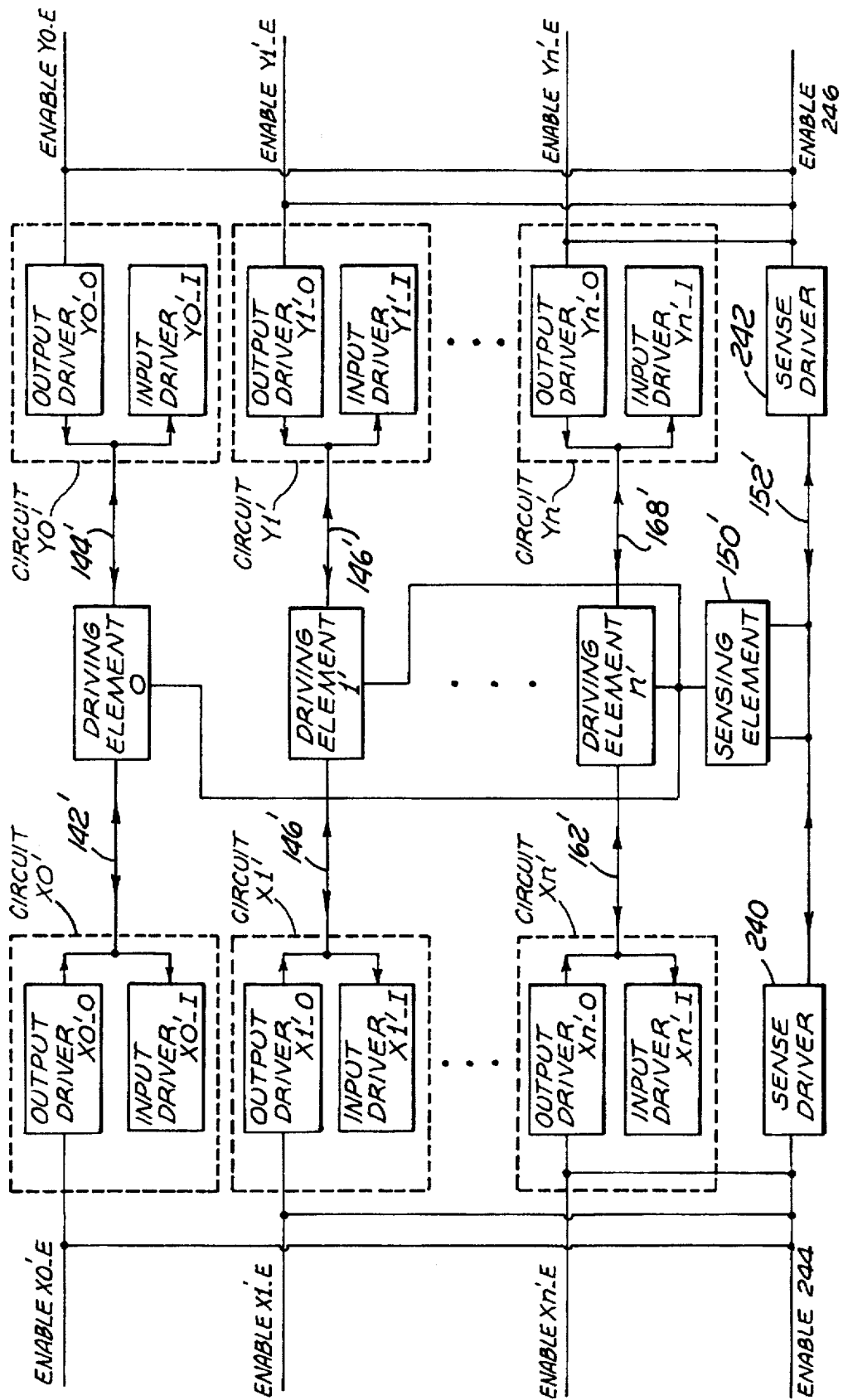
FIG. 13 is a block diagram of a bidirectional bus circuit connected to a plurality of sets of circuits illustrating how the output drivers of the circuits are coordinated with the sense drivers of the bidirectional bus circuit.

FIG. 13 illustrates how the output drivers of the various circuits can be coordinated with the sense drivers of a bidirectional bus circuit. The bidirectional bus circuit in FIG. 13 includes a plurality of sets of bus line portions, bus direction sense line 152', sensing element 150', sense drivers 240 and 242, and driving elements 0'-n'. Each of the circuits (X0'-Yn') includes an output driver and an input driver. Each of the output drivers is connected to an enable signal which enables the output driver to send a bus signal onto its bus line portion. Each of these enable signals is also connected to its corresponding sense driver of the bidirectional bus circuit. For example, enable signals X0'_E, X1'_E, . . . , Xn'_E are connected to sense driver 240 while enable signals Y0'_E, Y1'_E, . . . , Yn'_E are connected to sense driver 242. When any of the output drivers is enabled, its corresponding sense driver is also enabled.

For instance, if circuit X0' is ready to send its bus signal from circuit X0' to circuit Y0', enable signal X0'_E enables output driver X0'_O so that the bus signal can be sent out to bus line portion 142'. Enable signal X0'_E is also connected to sense driver 240 so that sense driver 240 can send a bus direction signal onto bus direction sense line 152'. The timing sequence is such that the bus direction signal is sent onto bus direction sense line 152' just before the bus signal is sent onto bus line portion 142'. Similarly, if any of the other output drivers (X1'_E . . . Xn'_E) is enabled, sense driver 240 will be also enabled to send a bus direction signal onto bus direction sense line 152'. In addition, if any of enable signals Y0'_E, Y1'_E, . . . , Yn'_E is active, then sense driver 242 will send a bus direction signal onto bus direction sense line 152'.

The present invention provides several advantages. The present invention allows signal repeaters to be placed along bidirectional bus lines. In addition, if the distance between two circuits (such as circuits 100 and 120 in FIG. 5) is excessively long, then multiple driving elements can be placed in series while using a single sensing element and a single bus direction sense line. Moreover, if a system has multiple bus lines, as shown in FIGS. 5 and 6, carrying signals that travel in a common direction at a given time, then a bidirectional bus circuit of the present invention can provide multiple driving elements for the multiple bus lines while having a single sensing element and a single sense line. Thus, the present invention can provide many signal repeaters in a minimum area because a single sensing element and a single bus direction sense line can be used with multiple driving elements.

As the circuit chip size increases, bus lines become narrower, thinner, and longer. Hence, the resistance and capacitance of the bus lines become larger. Thus, the bus signals that travel along the bus lines degrade even further. To solve this problem, the present invention provides bidirectional bus circuits that allow bidirectional bus signals to be driven over greater distances with less signal degradation and at a higher speed. Therefore, bidirectional bus circuits are of great need as the physical size of the chips continues to increase and the dimensions of interconnect lines continue to decrease.

It should be noted that the present invention's bidirectional bus circuits can be implemented not only in a circuit chip but also on a printed circuit board.

While the present invention has been particularly described with reference to the various figures and embodiments, it should be understood that these are for illustration only and should not be taken as limiting the scope of the invention. Many changes and modifications may be made to the invention, by one having ordinary skill in the art, without departing from the spirit and scope of the invention.

What is claimed is:

1. A bidirectional bus circuit comprising:

a first and a second bus line portion for carrying a bidirectional signal, said first bus line portion having a first and a second end, said second bus line portion having a third and a fourth end;

a bus direction sense line for carrying a bus direction signal;

a sensing circuit coupled to said sense line for detecting said bus direction signal; and a driving circuit coupled to said sensing circuit and coupled between said second end of said first bus line portion and said third end of said second bus line portion for driving said first and second bus line portions, wherein said sensing circuit includes two input lines and two output lines, wherein said two input lines are coupled to said bus direction sense line and said two output lines are coupled to said driving circuit.

2. A bidirectional bus circuit according to claim 1, wherein said sensing circuit includes a cross coupled NAND gate latch.

3. A bidirectional bus circuit according to claim 1, wherein said sensing circuit includes a cross coupled NOR gate latch.

4. A bidirectional bus circuit according to claim 1, wherein said sensing circuit detects said bus direction signal to determine which direction said first and second bus line portions is to be driven.

5. A bidirectional bus circuit according to claim 1, further comprising:

a third and a fourth bus line portion for carrying a bidirectional signal, said third bus line portion having a fifth and a sixth end, said fourth bus line portion having a seventh and an eighth end; and a second driving circuit coupled to said sensing circuit and coupled between said sixth end of said third bus line portion and said seventh end of said fourth bus line portion for driving said third and fourth bus line portions.

6. A bidirectional bus circuit according to claim 1, further comprising:

a first output driver circuit and a first input driver circuit coupled to said first end of said first bus line portion, said first output driver circuit coupled to a first driver enable line;

a second output driver circuit and a second input driver circuit coupled to said fourth end of said second bus line portion, said second output driver circuit coupled to a second output driver enable line;

a first sense driver circuit coupled to one end of said bus direction sense line and to said first driver enable line; and a second sense driver circuit coupled to another end of said bus direction sense line and to said second driver enable line.

7. A bidirectional bus circuit according to claim 1, wherein said two input lines detect said bus direction signal at two different points along said bus direction sense line.

8. A bidirectional bus circuit according to claim 1, wherein said sensing circuit enables only one of said two output lines depending on the direction of said bus direction signal.

9. A bidirectional bus circuit according to claim 7, wherein the time difference between when said bus direction signal arrives at one of said two different points and when said bus direction signal arrives at the other of said two different points is 5–25 pico seconds.

10. A bidirectional bus circuit according to claim 1, wherein said sensing circuit includes:
   a first NAND gate having a first and a second sense input line and a first sense output line, said first sense input line coupled to said bus direction sense line, said first sense output line coupled to said driving circuit; and
   a second NAND gate having a third and a fourth sense input line and a second sense output line, said third sense input line coupled to said bus direction sense line, said fourth sense input line coupled to said first sense output line, said second sense output line coupled to said second sense input line and to said driving circuit.

11. A bidirectional bus circuit according to claim 1, wherein said sensing circuit includes:
   a first NOR gate having a first and a second sense input line and a first sense output line, said first sense input line coupled to said bus direction sense line, said first sense output line coupled to said driving circuit; and
   a second NOR gate having a third and a fourth sense input line and a second sense output line, said third sense input line coupled to said bus direction sense line, said fourth sense input line coupled to said first sense output line, said second sense output line coupled to said second sense input line and to said driving circuit.

12. A bidirectional bus circuit according to claim 1, wherein said driving circuit includes a first driver circuit for driving said first and second bus line portions in a first direction and a second driver circuit for driving said first and second bus line portions in a second direction.

13. A bidirectional bus circuit according to claim 12, wherein only one of said first and second driver circuits is enabled at a time.

14. A bidirectional bus circuit according to claim 1, wherein said driving circuit includes:
   a first buffer circuit having a first buffer input line, a first buffer output line, and a first and a second buffer enable line, said first buffer input line coupled to said second end of said first bus line portion, said first buffer output line coupled to said third end of said second bus line portion; and
   a second buffer circuit having a second buffer input line, a second buffer output line, and a third and a fourth buffer enable line, said second buffer input line coupled to said second end of said first bus line portion, said second buffer output line coupled to said third end of said second bus line portion, said third buffer enable line coupled to said second buffer enable line and to said sensing circuit, said fourth buffer enable line coupled to said first buffer enable line and to said sensing circuit.

15. A bidirectional bus circuit according to claim 1, wherein said sensing circuit includes:
   a first NAND gate having a first and a second sense input line and a first sense output line, said first sense input line coupled to said bus direction sense line; and
   a second NAND gate having a third and a fourth sense input line and a second sense output line, said third sense input line coupled to said bus direction sense line, said fourth sense input line coupled to said first sense output line, said second sense output line coupled to said second sense input line, wherein said driving circuit includes:
   a first buffer circuit having a first buffer input line, a first buffer output line, and a first and a second buffer enable line, said first buffer input line coupled to said second end of said first bus line portion, said first buffer output line coupled to said third end of said second bus line portion; and
   a second buffer circuit having a second buffer input line, a second buffer output line, and a third and a fourth buffer enable line, said second buffer input line coupled to said second end of said first bus line portion, said second buffer output line coupled to said third end of said second bus line portion, said third buffer enable line coupled to said second buffer enable line and to said first sense output line, said fourth buffer enable line coupled to said first buffer enable line and to said second sense output line.

16. A bidirectional bus circuit according to claim 1, wherein said sensing circuit includes:
   a first NOR gate having a first and a second sense input line and a first sense output line, said first sense input line coupled to said bus direction sense line; and
   a second NOR gate having a third and a fourth sense input line and a second sense output line, said third sense input line coupled to said bus direction sense line, said fourth sense input line coupled to said first sense output line, said second sense output line coupled to said second sense input line, wherein said driving circuit includes:
   a first buffer circuit having a first buffer input line, a first buffer output line, and a first and a second buffer enable line, said first buffer input line coupled to said second end of said first bus line portion, said first buffer output line coupled to said third end of said second bus line portion; and
   a second buffer circuit having a second buffer input line, a second buffer output line, and a third and a fourth buffer enable line, said second buffer input line coupled to said second end of said first bus line portion, said second buffer output line coupled to said third end of said second bus line portion, said third buffer enable line coupled to said second buffer enable line and to said first sense output line, said fourth buffer enable line coupled to said first buffer enable line and to said second sense output line.

17. A bidirectional bus circuit comprising:
   a first and a second bus line portion for carrying a bidirectional signal, said first bus line portion having a first and a second end, said second bus line portion having a third and a fourth end;
   a bus direction sense line for carrying a bus direction signal;
   sensing means for detecting said bus direction signal; and
   driving means for driving said first and second bus line portions, wherein said sensing means includes two input lines and two output lines, wherein said two input lines are coupled to said bus direction sense line and said two output lines are coupled to said driving means.

18. A method of driving a bidirectional bus line in a bidirectional bus circuit, comprising the steps of:
   determining the direction of a signal on said bidirectional bus line; wherein said bidirectional bus circuit includes a sense line for carrying a bus direction signal, said determining performed by detecting said bus direction signal at two locations along said sense line; and
   driving said bidirectional bus line in the direction of said signal.

19. A method according to claim 18, wherein said bidirectional bus includes a sense line for carrying a bus direction signal, and wherein said step of determining the direction of said signal on said bidirectional bus line includes the step of detecting said bus direction signal on said sense line.

20. A method according to claim 18, wherein said step of determining the direction of said signal on a bidirectional bus line further includes the step of latching the bus direction signal obtained from said two locations.

21. A method according to claim 18, wherein said bidirectional bus line is coupled to a driving circuit having two buffers, and wherein said step of driving said bidirectional bus line includes the step of enabling only one of said two buffers.

22. A method according to claim 18 further including the step of:

driving another bidirectional bus line in the direction of said signal simultaneously with the step of driving said bidirectional bus line.

23. A system comprising:

a memory; and a processor including a bidirectional bus circuit comprising:

a first and a second bus line portion for carrying a bidirectional signal, said first bus line portion having a first and a second end, said second bus line portion having a third and a fourth end;

a bus direction sense line for carrying a bus direction signal;

a sensing circuit coupled to said sense line for detecting said bus direction signal; and a driving circuit coupled to said sensing circuit and coupled between said second end of said first bus line portion and said third end of said second bus line portion for driving said first and second bus line portions, wherein said sensing circuit includes two input lines and two input lines, wherein said two input lines are coupled to said bus direction sense line and said two output lines are coupled to said driving circuit.

* * * * *